(12) United States Patent
Li

(10) Patent No.: US 11,114,260 B2
(45) Date of Patent: Sep. 7, 2021

(54) SCISSOR-LEG STRUCTURAL KEY AND ITS SWITCH DEVICE, AND A KEYBOARD APPLYING THE KEY

(71) Applicant: DONGGUAN MINGJIAN ELECTRONIC TECHNOLOGY CO., LTD, Guangdong (CN)

(72) Inventor: Jianping Li, Guangdong (CN)

( * ) Notice: Subject to any disclaimer, the term of this patent is extended or adjusted under 35 U.S.C. 154(b) by 612 days.

(21) Appl. No.: 16/076,334

(22) PCT Filed: Sep. 1, 2017

(86) PCT No.: PCT/CN2017/100263
§ 371 (c)(1),
(2) Date: Aug. 8, 2018

(87) PCT Pub. No.: WO2018/184347
PCT Pub. Date: Oct. 11, 2018

(65) Prior Publication Data
US 2021/0183595 A1   Jun. 17, 2021

(30) Foreign Application Priority Data
Apr. 7, 2017  (CN) .......................... 201710227037.1

(51) Int. Cl.
*H01H 13/70* (2006.01)
*H01H 13/7065* (2006.01)
*H01H 13/83* (2006.01)

(52) U.S. Cl.
CPC ........ *H01H 13/7065* (2013.01); *H01H 13/83* (2013.01); *H01H 2231/002* (2013.01); *H01H 2235/01* (2013.01)

(58) Field of Classification Search
CPC ............... H01H 13/7065; H01H 13/83; H01H 2231/002; H01H 2235/01; H01H 3/125; H01H 13/70; H01H 13/86
USPC ......................... 200/5 A, 314, 341, 344, 345
See application file for complete search history.

(56) References Cited

U.S. PATENT DOCUMENTS

| 2013/0087440 | A1* | 4/2013 | Huang | H01H 13/83 200/314 |
| 2014/0190804 | A1* | 7/2014 | Zhang | H01H 13/83 200/314 |
| 2018/0025863 | A1* | 1/2018 | Lee | H01H 13/7065 200/5 A |

* cited by examiner

*Primary Examiner* — Edwin A. Leon
*Assistant Examiner* — Iman Malakooti
(74) *Attorney, Agent, or Firm* — Prakash Nama; Global IP Services, PLLC

(57) ABSTRACT

A switch device, having a reset assistant part arranged at the second end of a male leg, and a ram; the reset assistant part being provided with a holding station, both sidewalls of which are each provided with a saddle, both sides of the ram being provided, with a cam matching with the saddle, the ram is hung from the saddle through two cams. Accordingly, a photoelectrical type switch of scissor-leg structure is realized, and the key is enabled to have an obvious stage sense and sound.

28 Claims, 6 Drawing Sheets

SCISSOR-LEG STRUCTURAL KEY AND ITS SWITCH DEVICE, AND A KEYBOARD APPLYING THE KEY

BACKGROUND OF THE INVENTION

This invention relates to a field of key and keyboard, especially to a scissor-leg structural key, and a switch device thereof, and a keyboard applying the key.

The scissor-leg structural film switch keyboards are broadly used in the laptop keyboards as thin product thickness. The scissor-leg structure also known as X structure, is named as SCISSOR, worked in that it uses two groups of parallel four-bar linkage to be forced moving so as for users to enjoy pleasant and consistent hand touch when the users press four corners of the key, made from lightweight model steel, with robust structure and better durability than general keyboards. Scissor-leg structural design is most used in the laptop and ultra-thin PC keyboard. It makes use of two groups of linkage carriage of scissor shape, the key stroke is general 2.0 mm-3.0 mm more or less, and such design enables users' fingers uniformly pressing the key caps and acquiring the same hand touch for every key.

A utility patent serial No. 201410583955.4, titled as "A keyboard key", discloses a scissor-leg key structure of photoelectrical type, which realizes a scissor-leg structural photoelectrical switch to overcome noise problems easy to occur to mechanical switches. But this structure could not have obvious stage sense and sound, is short of comfortable hand touch, and could not meet usage requirements.

BRIEF SUMMARY OF THE INVENTION

A first objective of this invention is to overcome shortages of the prior art, to provide a optical path switch device which can increase stability of pressing keys and realize more obvious stage sense, when it is applied in the scissor-leg structural keys.

A second and a third objective of this invention are to provide a scissor-leg structural key.

A fourth and a fifth objectives of this invention are to provide a keyboard having the scissor-leg structural keys.

This invention adopts the following technical solution for above objectives:

a switch device, comprising resettable scissor-legs which include a male leg and a female leg, forming a scissor structure, and a mounting receptacle, the first end of male leg hinged to the mounting receptacle, and the first end of the female leg slidably arranged in the mounting receptacle;

a reset assistant part arranged at the second end of the male leg, the reset assistant part provided with a holding station, both sidewalls of which are each provided with a saddle;

a ram, both sides of which are provided with a cam matching with the saddle, the ram hanged from the saddles through the two cams;

the mounting receptacle provided with a recess portion for receiving the ram;

the ram arranged on the sidewalls of the recess portion when the scissor-leg structure is in the original position, and moved in the direction capable of dropping into the recess portion when the scissor-leg structure is depressed, and dropped in the recess portion after the scissor-legs are depressed into a stagnation point, and the saddle resetting the ram during the scissor-leg structure reset.

Preferably, it further comprises a push part for pushing the ram to move, the push part arranged at a first end of the female leg; and pushing the ram to move when the scissor-legs are furled.

Preferably, the saddle is on the dropping locus of the cam after the scissor-leg is depressed into stagnation point.

Preferably, the saddle comprises a concave curved surface having a rising trend from the ends to a connection portion, and a platform surface connected with the concave curved surface, the bottom of the cam being a surface with a top recess portion.

Preferably, the sidewalls of the recess portion form into a first stop, the outside of the ram is provided with a second stop matching with the first stop; the first stop and the second stop are interlocked when the ram falls into the recess portion.

Preferably, the sidewalls of the recess portion form into three stop grooves as the first stops, which are distributed as a triangle, and three stop blocks are formed on the outsides of the ram as the second stops and distributed as a triangle.

Preferably, the holding station is a stop frame which is nested on the outside of the ram.

A scissor-leg structural key is characterized in comprising the switch device, and a key cap arranged above the scissor-leg.

Preferably, it further comprises a return spring, which is arranged between the key cap and the ram, one end of the return spring arranged at the key cap, and another end arranged at the ram.

Preferably, it further comprises a pedestal for mounting the scissor-leg structural key on a circuit board, and the mounting receptacle is arranged on the pedestal.

Preferably, a LED lamp is arranged on the mounting receptacle near the middle of the scissor-leg.

Preferably, a primary spring is arranged at the middle of the scissor-leg for actuating the scissor-leg to reset; one end of the primary spring is arranged at the mounting receptacle; the key cap depresses the primary spring and the scissor-leg when the key cap is depressed, and the primary returns after external force is removed, and actuates the key cap and the scissor-leg to reset.

A scissor-leg structural key comprises the switch device a; a key cap is arranged above the scissor-leg; optical element holding stations are arranged respectively on both of the opposite sides of the recess portion, the light receiver element and the light transmitter element are respectively arranged at the two optical element holding stations.

Preferably, the optical element holding station is connected with the recess portion by arranging a transmission hole.

Preferably, it further comprises a return spring, which is arranged between the key cap and the ram, one end of the return spring arranged at the key cap, and another end arranged at the ram.

Preferably, the top of the ram is provided with a recess for stopping the return spring, the end portion of the return spring arranged in the recess.

Preferably, it further comprises a pedestal for mounting the scissor-leg structural key on a circuit board, and the mounting receptacle is removably mounted on the pedestal.

Preferably, it further comprises a pedestal for mounting the scissor-leg structural key on a circuit board, and the mounting receptacle is secured on the pedestal, the mounting receptacle and the pedestal being an unbreakable unity.

Preferably, a dirt-proof cover is provided between the male and female legs and the key cap; the dirt-proof cover closes on the male and female legs, and the opening edge is embedded in the mounting receptacle; the second end of the female leg is hinged to the dirt-proof cover, and the second end of the male leg is slidably arranged in the dirt-proof cover.

Preferably, a LED lamp is arranged on the mounting receptacle near one side of the scissor-leg.

Preferably, the LED lamp is at the middle of the scissor-leg.

Preferably, a primary spring is arranged at the middle of the scissor-leg for actuating the scissor-leg to reset; one end of the primary spring is arranged at the mounting receptacle; the key cap depresses the primary spring and the scissor-leg when the key cap is depressed, and the primary returns after external force is removed, and actuates the key cap and the scissor-leg to reset.

A scissor-leg structural keyboard comprises a scissor-leg structural key according to any one of the claims 8 to 12, and a chassis having a circuit board, the scissor-leg structural key arranged on the chassis.

Preferably, a layer of protection film is provided on the circuit board.

A scissor-leg structural keyboard comprises the scissor-leg structural key, and a chassis having a circuit board, the scissor-leg structural key arranged on the chassis.

Preferably, the chassis comprises a flexible circuit board, a protection plate and a mounting panel arranged from bottom to top; the pedestal is arranged on the mounting panel; the light receiver element and light transmitter element are connected with the flexible circuit board.

Preferably, the optical element holding station is a hollow structure, the pedestal is provided with a hollow structure corresponding to the light transmitter element and light receiver element, the light transmitter element and light receiver element are arranged on the mounting panel; and through-holes are provided on the protection plate respectively corresponding to the light transmitter element and light receiver element.

Preferably, the recess portion is a structure penetrating through the mounting receptacle, and second through-holes corresponding to the recess portion are respectively provided on the mounting panel and the protection plate.

This invention has the following useful benefits comparing with the prior art:

With the structure said above, not only a photoelectrical type switch of a scissor-leg key is realized, and noise problem easy to occur to mechanical switch is overcome, but also stability of pressing key is increased and a obvious stage sense is realized. By the mounting receptacle removably mounted on the pedestal, the key is enabled to be modular, easy to be assembled, and make the keyboard extending use life as a whole.

Figure 1:
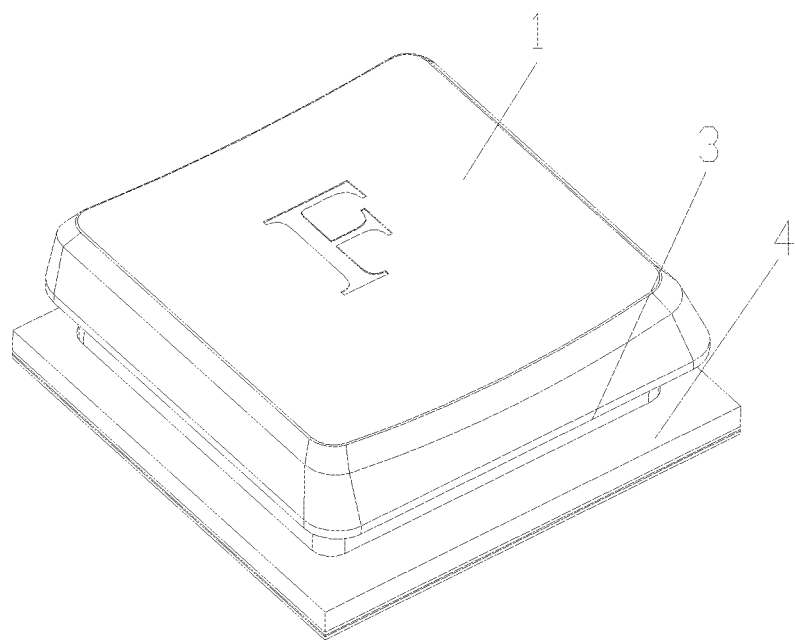
FIG. 1 is a structural representation of the scissor-leg structural key described by this invention.
Figure 2:
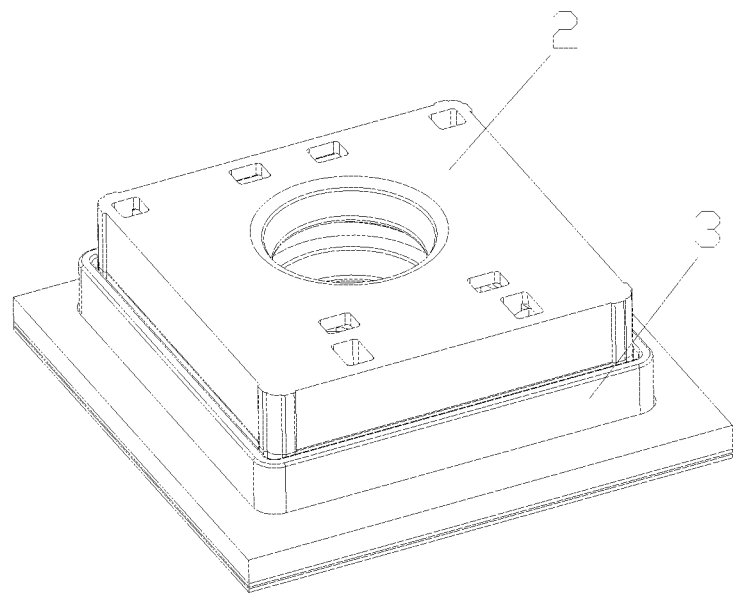
FIG. 2 is a structural representation of the scissor-leg structural key described by this invention (with the key cap omitted)
Figure 3:
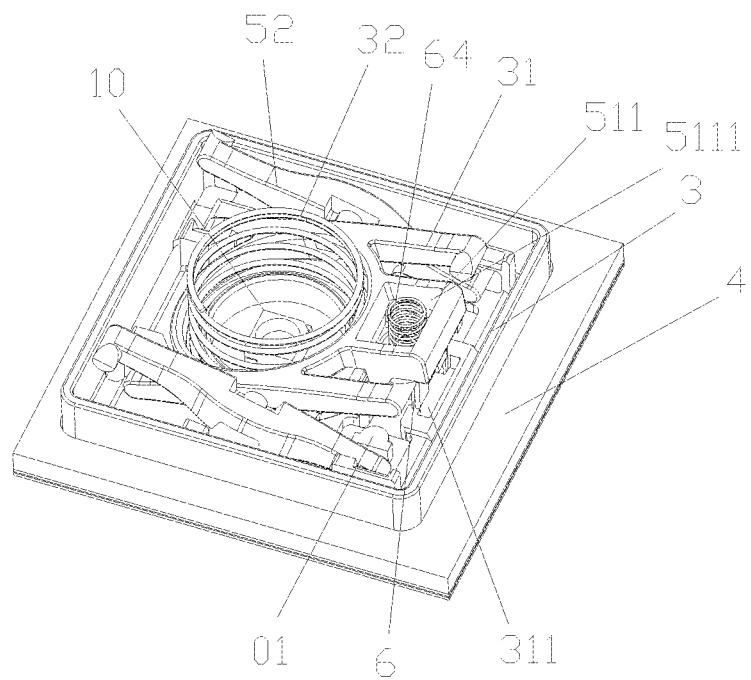
FIG. 3 is a structural representation of the scissor-leg structural key described by this invention (with the key cap and dirt-proof cover omitted)

1—key cap; 2—dirt-proof cover; 3—mounting receptacle; 311—recess portion; 312—stop groove; 313—transmission hole; 314—optical element holding station; 32—primary spring; 4—pedestal; 51—male leg; 511—reset assistant part; 5111—holding station; 5112—saddle; 52—female leg; 521—push part; 6—ram; 61—cam; 62—stop block; 63—recess; 64—return spring; 7—mounting panel; 8—protection plate; 9—flexible circuit board; 10—LED lamp; 01—optical coupler.

DETAILED DESCRIPTION OF THE INVENTION

This invention is now further described in connection with appended figures and particular embodiments.

As shown in FIGS. 2 to 7, and 9, this invention describes a switch device which comprises a resettable scissor-leg and mounting receptacle 3, a reset assistant part 511, a ram 6, and a push part 521 for pushing the ram 6 to move.

The scissor-legs include a male leg 51 and a female leg 52, which are hinged to form into a structure of scissor shape; the first end of the male leg 51 is hinged to the mounting receptacle 3, and the first end of the female leg is slidably arranged in the mounting receptacle 3.

The reset assistant part 511 is arranged at the second end of the male leg 51; the reset assistant part 511 is provided with a holding station 5111, which is a stop frame, both sidewalls of the stop frame respectively extending out of the saddle 5112; the stop frame is preferably a square. The push part 521 is arranged at the first end of the female leg 52.

Both sides of the ram 6 are provided with cams 61 matching with the saddle 5112, the ram 6 hanged from the saddle 5112 through the two cams 61; the stop frame is nested on the outside of the ram 6. The basic shape of the ram 6 is a cuboid whose radial section is a square with round corner.

The mounting receptacle 3 is provided with a recess portion 311 for receiving the ram 6.

The sidewalls of the recess portion 311 form into a first stop, the outside of the ram 6 is provided with a second stop matching with the first stop; the first stop and the second stop are interlocked when the ram 6 falls into the recess portion. The ram 6 is enabled to fall into an accurate position when it falls into the recess portion 311.

Figure 8:
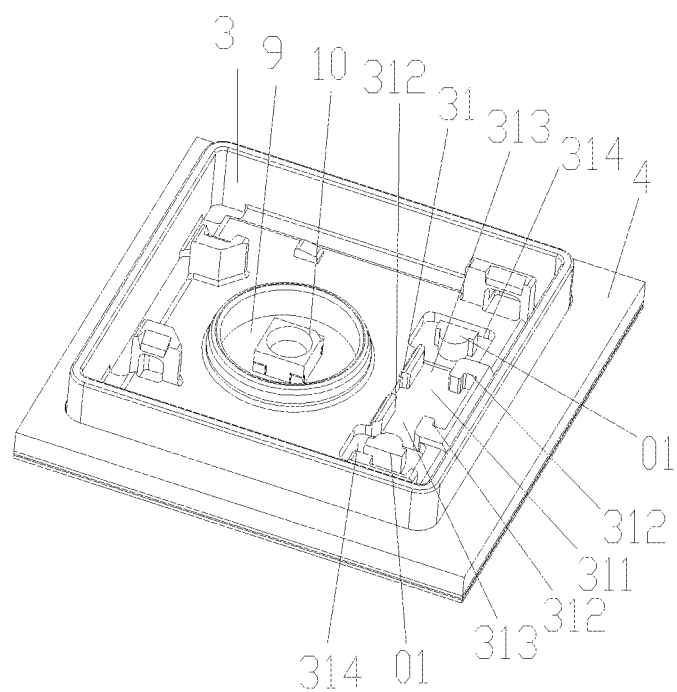
FIG. 8 is a schematic view of the structure of the mounting receptacle and the pedestal described by this invention.
Figure 9:
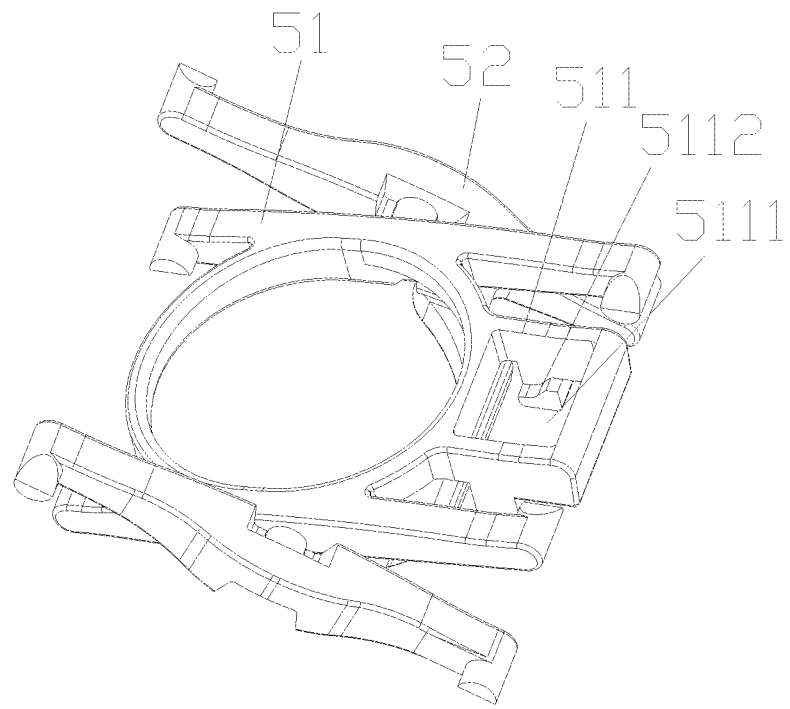
FIG. 9 is a structural representation of the scissor-leg structure described by this invention.

As shown in FIG. 8, the sidewalls of the recess portion preferably form into three stop grooves 312, including a first, second and third stop grooves 312 which are distributed as a triangle. The first stop groove is formed by sidewall recess, both of the second and third stop grooves are formed by surroundings of the sidewall and a stop baffle extending from the sidewall.

The ram 6 is placed on the two opposite sidewalls when the scissor-leg structure is in the original position, so that the ram 6 can be placed stably; as shown in FIG. 1, the ram 6 is placed on the sidewall of the recess portion 311 and the sidewalls of the stop grooves 312.

Figure 5:
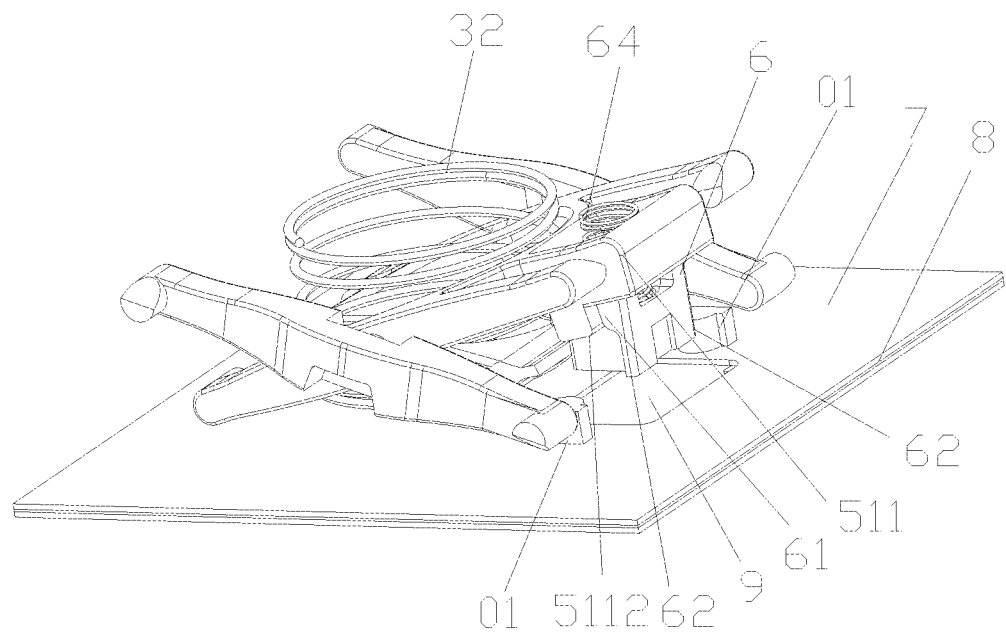
FIG. 5 is a structural representation of the scissor-leg structural key described by this invention (with the key cap, dirt-proof cover, mounting receptacle and pedestal omitted)
Figure 6:
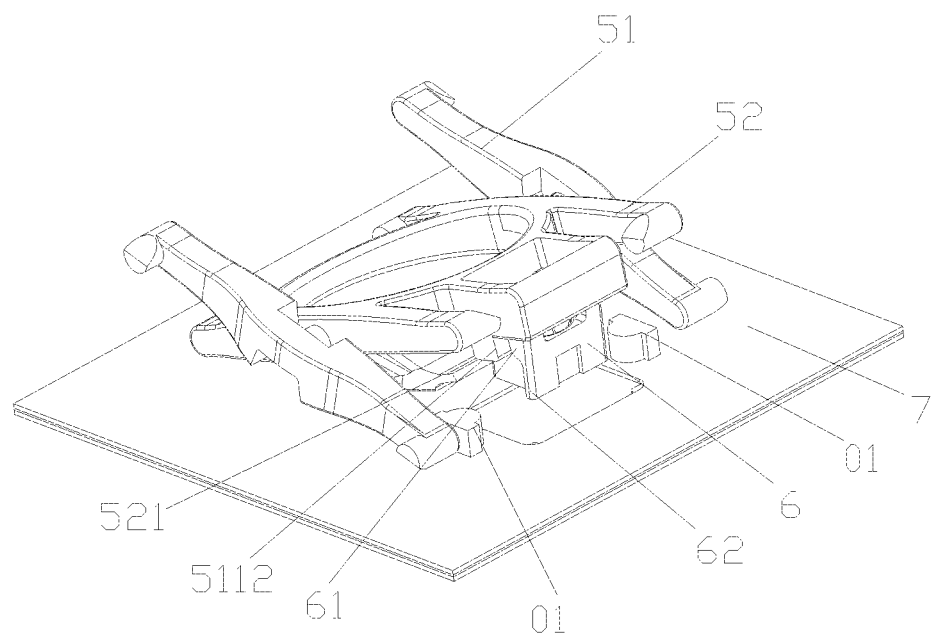
FIG. 6 is a structural representation of the optical path switch device described by this invention (with the return spring omitted)

The ram 6 can move in the direction of falling into the recess portion 311 when the scissor-legs are depressed; the ram 6 falls into the recess portion 311 after the scissor-legs are depressed to the stagnation point; and the saddle 5112 brings the ram 6 to reset during the reset of the scissor-legs. The push part 521 pushes the ram 6 to move when the scissor-legs are depressed. The push part 521 provides an additional drive for the ram 6 when it moves towards the recess portion 311, enabling the ram 6 to not solely depend on its self ramming force; when the scissor-legs are depressed, the ram 6 is made to move more obviously toward the recess portion 311 and falls into the recess portion 311 as required. As shown in FIGS. 5 and 6, the section of the push part 521 is a generally convex shape.

Figure 7:
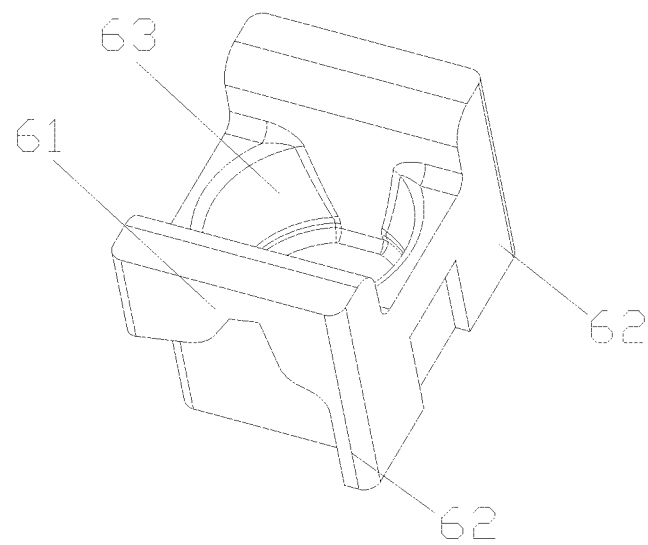
FIG. 7 is a structural representation of the ram described by this invention.

In order for the ram 6 able to better move on the saddle 5112 and fall into the recess portion 311, and able to be smoothly raised by the saddle 5112 when the scissor-legs are reset, as shown in FIG. 7, the saddle 5112 comprises a concave curved surface having a rising trend from the ends to a connection portion, and a platform surface connected with the concave curved surface, the bottom of the cam 6 being a surface with a top recess portion.

By applying the above structure to the scissor-leg key, not only an input way of the photoelectrical signal of the scissor-leg structural key is realized, to overcome noise problems easy to occur to mechanical switches; but also the key is enable to have an obvious stage sense and sound, because the ram 6 falls into the recess portion 311, striking the bottom of the recess portion 311 and making a sound. In order to produce better and more obvious sound, the position of saddle is on the dropping locus of the cam after the scissor-legs are depressed into the stagnation point, at this time, the cam striking the saddle, so as to produce obvious sound.

With reference to FIG. 1 to 9, a first embodiment of a scissor-leg structural key described by this invention is embodied below:

The scissor-leg structural key described by this invention comprises a key cap 1, a light receiver element, a light transmitter element, a return spring 64, a switch device described by this invention, and a pedestal 4 for restricting the key unity to the circuit board. The pedestal 4 is a frame structural base body, mainly comprising a closed frame. A mounting receptacle 3 is removably mounted in the pedestal 4; the outside of the mounting receptacle 3 is provided with a male buckle, and the inside of the pedestal 4 is provided with a female buckle, the mounting receptacle 3 being arranged on the pedestal 4 through interlock of the male and female buckles; it is also feasible to provide the female buckle on the outside of the mounting receptacle 3, and provide the male buckle on the inside of the pedestal 4. The pedestal 4 and the mounting receptacle 3 can also be an unbreakable unity.

Both the opposite sides of the recess portion 311 are each provided with an optical element holding station 314, which is connected with the recess portion 311 by arranging transmission holes 313; the light receiver element and the light transmitter element are respectively arranged in the two optical element holding stations 314; as shown in FIG. 8, the two transmission holes 313 are on the two opposite sidewalls. As an alternative, both the opposite inner walls of the recess portion 311 are each provided an optical element holding station 314, i.e., it is feasible so long as the optical element holding stations are on both sides of the recess portion 311, and the light receiver element and the light transmitter element can form into an optical path.

Preferably, the light receiver element and the light transmitter element are respectively receiving and transmitting ends of a optical coupler 01, selected from one of light-emitting diode, light sensitive diode, phototriode, and light sensitive resistor, etc.

A dirt-proof cover 2 is provided above the scissor-leg, and a key cap 1 is provided above the dirt-proof cover 2; the dirt-proof cover 2 closes upon the male leg 51 and female leg 52, and the opening edge of the dirt-proof cover 2 is embedded in the mounting receptacle 3. The second end of the male leg 51 is slidably provided on the dirt-proof cover 2, and the second end of the female leg 52 is hinged to the key cap 1.

The top of the ram 6 is provided with a recess 63 for stopping the return spring 64. The return spring 64 is arranged between the dirt-proof cover 2 and the ram 6; one end of the return spring is arranged on the dirt-proof cover 2, and another end is arranged in the recess 63. A primary spring 32 is provided at the middle of the scissor-leg for actuating the reset of the scissor-leg structure. A positioning barrel is provided in the middle of the mounting receptacle 3, on which the lower end of the primary spring 2 is nested, and the upper end of the primary spring 2 abutting against the dirt-proof cover 2. A LED lamp 10 is arranged in the positioning barrel, which enables light to emit from the middle of the key cap 1, and makes the whole cap brighten.

Figure 10:
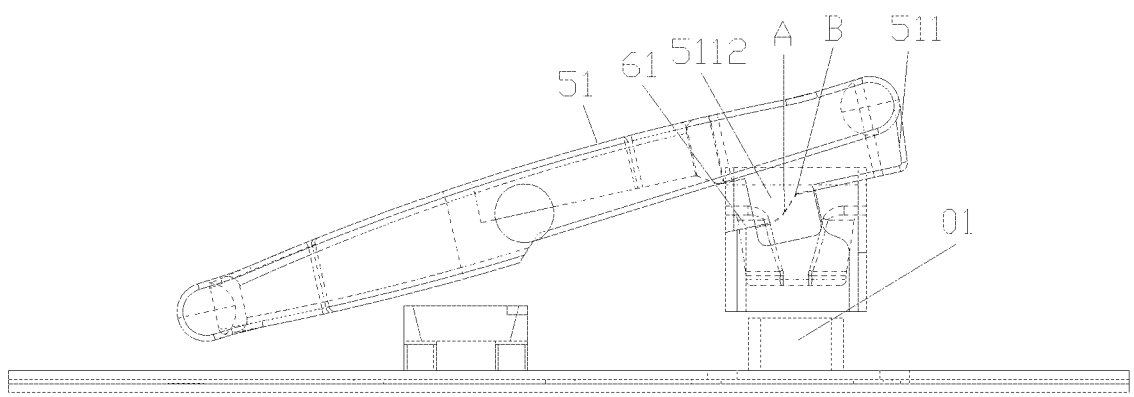
FIG. 10 is a schematic view of the state of the reset assistant part and the ram when the scissor-leg structure of the inventive scissor-leg structural key is in the original position.
Figure 11:
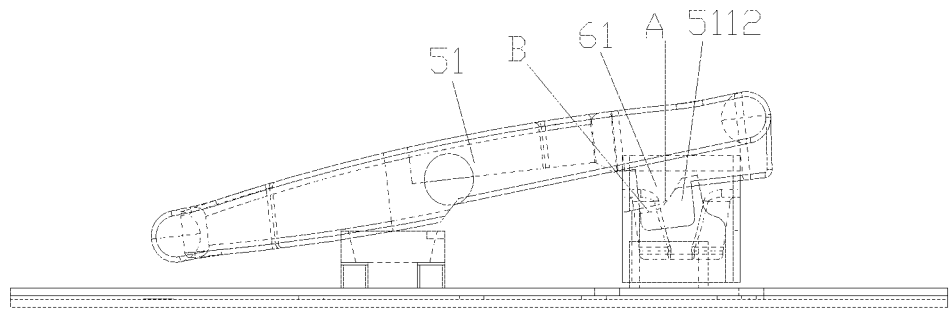
FIG. 11 is a schematic view of the state of the reset assistant part and the ram when the scissor-leg structure of the inventive scissor-leg structural key continues dropping down after stagnation point.
Figure 12:
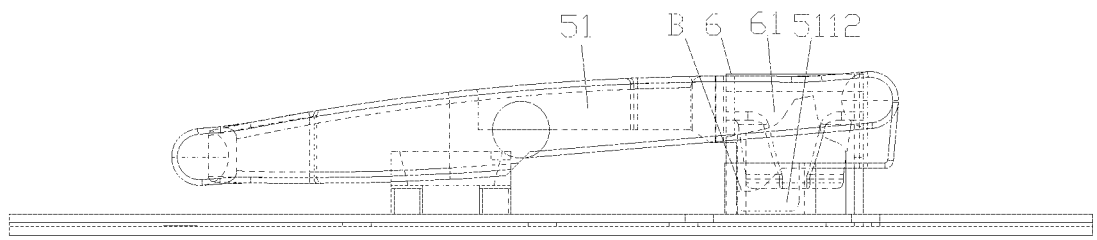
FIG. 12 is a schematic view of the state of the reset assistant part and the ram when the scissor-leg structure of the inventive scissor-leg structural key is in the lowest position.

With reference to FIG. 10 to 12, the working principle of the described scissor-leg structural key of this invention is described below.

In FIG. 10 to 12, the bottom of the cam 61 is referred by A, and the surface of the saddle 5112 is referred by B.

As shown in FIG. 10, when there is no external force to type the key, the scissor-leg structure will be in the original position, and the ram 6 is hanged from the saddle 5112 in a normal state.

Under the action of external force of typing the key 1, the primary spring 32 is depressed, and meanwhile the scissor-legs are furled and sink, and the second end of the male leg 51 and the first end of the female leg 52 make a translate;

The saddle 5112 of the reset assistant part 511 shifts its position, meanwhile the ram 6 moves in the direction of falling into the recess portion 311; when there is provided a push block on the female leg 52, the push block will play the role of pushing the ram 6 to move; as shown in FIG. 11, after the scissor-leg structure drops to the stagnation point and continues to drop down, the ram 6 falls into the recess portion 311; at this time, as shown in the figures, the cam 61 and the saddle 5112 are partially separated, the ram 6 blocks between the transmitting and receiving ends, and the switch produces an "ON" signal input. The ram 6 dropping to block off the optical path is crucial for realizing the signal input, so that it is assured that the ram 6 falls into the recess portion 311 accurately and in time by arranging a push part 521 on the female leg 52, and also the time and validity of the signal input of the whole key is assured. Due to typing action, the scissor-leg structure will continue to drop down, as shown in FIG. 12, the saddle 5112 will drop down to the lowest position, and the saddle 5112 is separated from the cam completely.

After external force of typing the key 1 is removed, the key cap is reset under the action of the primary spring 32, and an input is completed. Due to the action of the primary spring 32, the key cap 1 can be reset quickly, and the input rate is accelerated. The reset of the key cap 1 and the move path of the saddle 5112 can be referred to the state of FIG. 12 to 11, meanwhile the saddle 5112 is raised again by the cam 61, the key cap brings the scissor-leg structure to reset, and the saddle 5112 can brings the ram 6 to reset.

The described key of this invention is made modular, and it is possible to remove the mounting receptacle 3 from the pedestal 4 directly when one key is needed to be replaced. The other keys can continue to be used, and the removal operation doesn't impact other key structures. By the structure described above, not only an input way of the photoelectrical signal of the scissor-leg structural key is realized, to overcome noise problems easy to occur to mechanical switches; but also the key is enable to have an obvious stage sense and sound, because the ram 6 falls into the recess portion 311, striking the bottom of the recess portion 311 and making a sound.

A second embodiment of a scissor-leg structural key described in this invention is the same as the first embodiment except below structures.

In the scissor-leg structural key of this invention, the ram is a conductor or provided with a conductor, the two optical element holding stations are replaced with two capacitor holding stations, in which a first capacitor and a second capacitor are respectively arranged; the capacitor holding stations are not necessary to be connected with the recess portion. When the scissor-leg structural key of this invention is mounted on the keyboard chassis, both of the first and second capacitors are connected with the circuit board, and after the ram falls into the recess portion, the ram and the two capacitors form into capacitive induced effect, the ram triggers the two capacitors to produce signal input into the circuit, so as to realize information input of the key.

A third embodiment of a scissor-leg structural key described in this invention is the same as the first embodiment except below structures.

In the scissor-leg structural key described by this invention, the ram is a magnet or provided with a magnet; in corresponding to the ram, there is provided a Hall switch in the bottom of the recess portion or on the circuit board under the recess portion, which Hall switch is connected with the circuit board. When the scissor-leg structural key described by this invention is mounted on the keyboard chassis, after the ram falls into the recess portion, the distance between the magnet and the Hall switch is changed, so as to change the input/output of the Hall switch 70 for realizing information input of the key.

With reference to FIG. 1 to 8, a scissor-leg structural keyboard described by this invention comprises scissor-leg structural keys and a chassis having a circuit board, the scissor-leg structural keys mounted on the chassis.

The chassis comprises a flexible circuit board 9, a protection plate 8 and a mounting panel 7, which are arranged from bottom to top.

Figure 4:
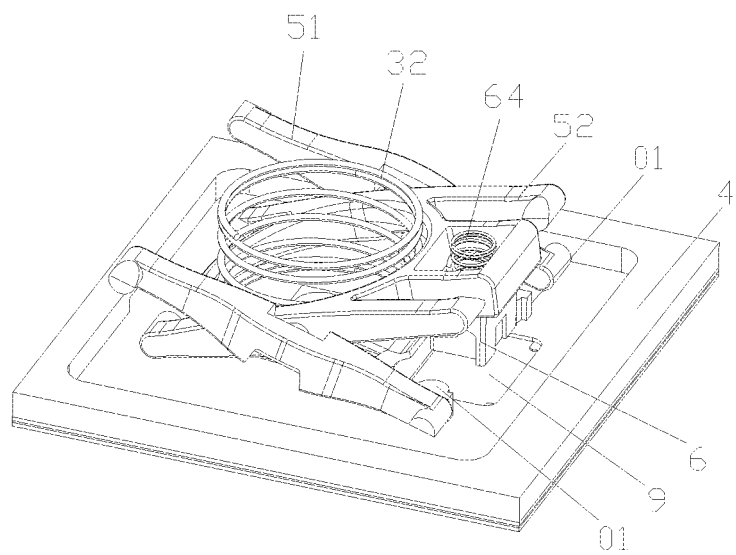
FIG. 4 is a structural representation of the scissor-leg structural key described by this invention (with the key cap, dirt-proof cover and mounting receptacle omitted)

The bottom of the positioning barrel on the mounting receptacle 3 is a penetration structure; the optical element holding station 314 is a hollow structure of the described mounting receptacle 3. The described pedestal 4, LED lamp 10, the light transmitter and receiver elements are all arranged on the mounting panel 7; there are provided first through-holes corresponding to the LED lamp 10, light transmitter and receiver elements on the protection plate, so as to expose the flexible circuit board 9, and the LED lamp 10, the light transmitter and receiver elements are all connected with the circuit board 9. Because the recess portion 311 as shown in FIG. 4 is a structure penetrating through the mounting receptacle 3, the recess portion 311 can expose the mounting panel. In order for the ram 6 to have enough stroke to drop down, there are provided second through-holes respectively on the mounting panel 7 and the protection plate 8 in corresponding to the recess portion 311, so as to enable the ram 6 to directly fall onto the flexible circuit board 9. Due to the ram 6 finally falls onto the circuit board 9 and makes a sound; the keyboard described by this invention not only realizes a way to input the photoelectrical signal of the scissor-leg structural key, and overcomes noise problem easy to occur to the mechanical switches; but also enables the key to have obvious stage sense and sound.

Because the circuit on the film are made from silver plasm, it is easy to be damaged by oxidation; the keyboard will be more robust by using the flexible circuit 9 to replace the film. In order to increase qualities, there is provided a protection plating film, i.e. a three-proofs plating film.

But under use requirements, the circuit board inside the chassis can also be a film circuit board, meanwhile there is no need to provide optical element for the scissor-leg structural key mounted on the chassis, it is only required to provide signal input points corresponding to the position of the recess portion on the film circuit, so that the ram strikes the signal input end after falling into the recess portion, so as to realize signal input of the key.

This invention is not limited to the above embodiments, it is also intended to include modifications and alters to these embodiments without depart from the spirit and scope of this invention, if such modifications and alters fall into range of the claims of this invention and equal technique limits.

What is claimed is:

1. A switch device comprising resettable scissor-legs which include a male leg and a female leg, forming a scissor structure, and a mounting receptacle, a first end of the male leg hinged to the mounting receptacle, and a first end of the female leg slidably arranged in the mounting receptacle a reset assistant part arranged a second end of the male leg, the reset assistant part provided with a holding station, both sidewalls of which are each provided with a saddle: a ram, both sides of which are provided with a cam matching with the saddle, the ram hanged from the saddles through the two cams; the mounting receptacle provided with a recess portion for receiving the ram; the ram arranged on the sidewalls of the recess portion when the scissor-leg structure is in an original position, and moved in a direction capable of dropping into the recess portion when the scissor-leg structure is depressed, and dropped in the recess portion after the scissor-legs are depressed into a stagnation point, and the saddle resetting the ram during the scissor-leg structure reset.

2. The switch device according to the claim 1, further comprises a push part for pushing the ram, the push part arranged at the first end of the female leg, the push part pushing the ram to move when the scissor-legs are furled.

3. The switch device according to the claim 1, characterized in that, the saddles are on a dropping locus of the cam after the scissor-legs are depressed into the stagnation point.

4. The switch device according to the claim 1, characterized in that, the saddle comprises a concave curved surface having a rising trend from one end of the concave curved surface to a connection portion, and a platform surface connected with the concave curved surface, a bottom of the cam being a surface with a top recess portion.

5. The switch device according to the claim 1, characterized in that, the sidewalls of the recess portion forming into a first stop, an outside of the ram is provided with a second stop matching with the first stop, and the first stop interlocked with the second stop when the ram is dropped in the recess portion.

6. The switch device according to the claim 5, characterized in that, the sidewalls form into three stop grooves as the first stops, which are distributed as a triangle, and three stop blocks are formed on the outside of the ram as the second stops and distributed as a triangle.

7. The switch device according to the claim 5, characterized in that, the holding station is a stop frame which is nested on the outside of the ram.

8. A scissor-leg structural key comprising a switch device according to claim 1, and a key cap is arranged on the scissor-legs.

9. The scissor-leg structural key according to the claim 8, further comprises a return spring arranged between the key cap and the ram; one end of the return spring is arranged at the key cap, and another end of the return spring is arranged at the ram.

10. The scissor-leg structural key according to the claim 8, further comprises a pedestal for mounting the scissor-leg structural key on a circuit board, and the mounting receptacle is arranged on the pedestal.

11. The scissor-leg structural key according to the claim 8, characterized in that, a LED lamp is arranged on the mounting receptacle near a middle of the scissor-leg.

12. The scissor-leg structural key according to the claim characterized in that, a primary spring is arranged at a middle of the scissor-leg for actuating the scissor-leg to reset; one end of the primary spring is arranged at the mounting receptacle; the key cap depresses the primary spring and the scissor-leg when the key cap is depressed, and the primary returns after external force is removed, and actuates the key cap and the scissor-leg to reset.

13. A scissor-leg structural key comprises a switch device according to claim 1; a key cap is arranged above the scissor-leg; optical element holding stations are arranged respectively on both of the opposite sides of the recess portion a light receiver element and a light transmitter element are respectively arranged at the two optical element holding stations.

14. The scissor-leg structural key according to the claim 13, characterized in that, the optical element holding station is connected with the recess portion by arranging a transmission hole.

15. The scissor-leg structural key according to the claim 13, further comprises a return spring arranged between the key cap and the ram; one end of the return spring is arranged at the key cap, and another end of the return spring is arranged at the ram.

16. The scissor-leg structural key according to the claim 15, characterized in that, a top of the ram is provided with a recess for stopping the return spring, the end portion of the return spring arranged in the recess.

17. The scissor-leg structural key according to the claim 13, further comprises a pedestal for mounting the scissor-leg structural key on a circuit board, and the mounting receptacle is removably mounted on the pedestal.

18. The scissor-leg structural key according to the claim 13, further comprises a pedestal for mounting the scissor-leg structural key on a circuit board, and the mounting receptacle is secured on the pedestal, the mounting receptacle and the pedestal being an unbreakable unity.

19. The scissor-leg structural key according to the claim 13, characterized in that, a dirt-proof cover is provided between the male and female legs and the key cap; the dirt-proof cover closes on the male and female legs, and the opening edge is embedded in the mounting receptacle; a second end of the female leg is hinged to the dirt-proof cover, and the second end of the male leg, is slidably arranged in the dirt-proof cover.

20. The scissor-leg structural key according to the claim 13, characterized in that, a LED lamp is arranged on the mounting receptacle near one side of the scissor-leg.

21. The scissor-leg structural key according to the claim 20, characterized in that, the LED lamp is at a middle of the scissor-leg.

22. The scissor-leg structural key according to the claim 1, characterized in that, a primary spring is arranged at a middle of the scissor-leg for actuating the scissor-leg to reset; one end of the primary spring is arranged at the mounting receptacle; the key cap depresses the primary spring and the scissor-leg when the key cap is depressed, and the primary returns after external force is removed, and actuates the key cap and the scissor-leg to reset.

23. A scissor-leg structural keyboard comprises a scissor-leg structural key according to claim 8, and a chassis having a circuit board, the scissor-leg structural key arranged on the chassis.

24. The scissor-leg structural keyboard according the claim 23, characterized in that, a layer of protection film is provided on the circuit board.

25. A scissor-leg structural keyboard comprises a scissor-leg structural key according to claim 13, and a chassis having a circuit board, the scissor-leg structural key arranged on the chassis.

26. The scissor-leg structural keyboard according to the claim 25, characterized in that, the chassis comprises a flexible circuit board, a protection plate and a mounting panel arranged from bottom to top; a pedestal is arranged on the mounting panel; the light receiver element and the light transmitter element are connected with the flexible circuit board.

27. The scissor-leg structural keyboard according to the claim 26, characterized in that, the optical element holding station is a hollow structure, the pedestal is provided with a hollow structure corresponding to the light transmitter element and light receiver element, the light transmitter element and light receiver element are arranged on the mounting panel, and first through-holes are provided on the protection plate respectively corresponding to the light transmitter element and light receiver element.

28. The scissor-leg structural keyboard according to the claim 27, characterized in that, the recess portion is a structure penetrating through the mounting receptacle, and second through-holes corresponding to the recess portion are respectively provided on the mounting panel and the protection plate.

* * * * *